United States Patent
Confalonieri et al.

(10) Patent No.: US 6,621,444 B1
(45) Date of Patent: Sep. 16, 2003

(54) HIGH SPEED, LOW POWER SWITCHED-CAPACITOR DIGITAL-TO-ANALOG CONVERTER WITH A PRECHARGE ARRANGEMENT

(75) Inventors: Pierangelo Confalonieri, Caponago (IT); Angelo Nagari, Cilavegna (IT); Marco Zamprogno, Cesano Maderno (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/174,501

(22) Filed: Jun. 17, 2002

(51) Int. Cl.[7] ................................................ H03M 1/12
(52) U.S. Cl. ...................................... 341/172; 341/144
(58) Field of Search ................................ 341/127, 150, 341/172, 144, 143

(56) References Cited

U.S. PATENT DOCUMENTS

| | | | | |
|---|---|---|---|---|
| 4,384,276 A | * | 5/1983 | Kelley et al. ............... | 341/150 |
| 4,412,208 A | * | 10/1983 | Akazawa et al. ........... | 341/145 |
| RE32,313 E | * | 12/1986 | Yamakido .................... | 341/127 |
| 5,581,252 A | * | 12/1996 | Thomas ....................... | 341/144 |
| 5,684,487 A | * | 11/1997 | Timko ......................... | 341/172 |
| 5,952,952 A | * | 9/1999 | Choi et al. .................. | 341/172 |
| 6,407,689 B1 | * | 6/2002 | Bazarjani et al. ........... | 341/143 |
| 6,486,812 B1 | * | 11/2002 | Tanaka ........................ | 341/144 |

* cited by examiner

*Primary Examiner*—Jean Bruner Jeanglaude
(74) *Attorney, Agent, or Firm*—Lisa K. Jorgenson; E. Russell Tarleton; Seed IP Law Group PLLC (57) ABSTRACT

A switched capacitor digital-to-analog converter includes a first voltage generator for providing first and second reference voltages, a second voltage generator for providing third and fourth reference voltages selected to match predetermined design values of the first and second reference voltages, and an array of binary weighted capacitors. Each capacitor has a first electrode connected to a common circuit node, which is connected to a converter output terminal and a second electrode selectively connected, through an associated first switching circuit, to either one of the first and second reference voltages or, through an associated second switching circuit, to either one of the third and fourth reference voltages. The converter includes a circuit for monitoring the values of each bit of input digital codes, and a control circuit coupled to the first and second switching circuits to open or close selectively during a bit clock period the connections to the first, second, third, and fourth voltages according to the following criterion: when a bit value of the current input digital code $B_j$ is equal to the corresponding bit value of the previous input digital code $B_{j-1}$, the first switching circuit is enabled and the second switching circuit is disabled during the whole bit clock period, and when the monitoring circuit detects a bit value of a current input digital code $B_j$ to be different from the corresponding bit value of the previous input digital code $B_{j-1}$, the first switching circuit is disabled and the second switching circuit is enabled during a starting time portion of the bit clock period, while the first switching circuit is enabled and the second switching circuit is disabled during the remaining portion of the bit clock period.

15 Claims, 6 Drawing Sheets

HIGH SPEED, LOW POWER SWITCHED-CAPACITOR DIGITAL-TO-ANALOG CONVERTER WITH A PRECHARGE ARRANGEMENT

BACKGROUND OF THE INVENTION

1. Field of the Invention

The present invention pertains to digital-to-analog converters, and more particularly to a switched capacitor digital-to-analog converter with selective precharging of a capacitor array.

2. Description of the Related Art

Figure 1:
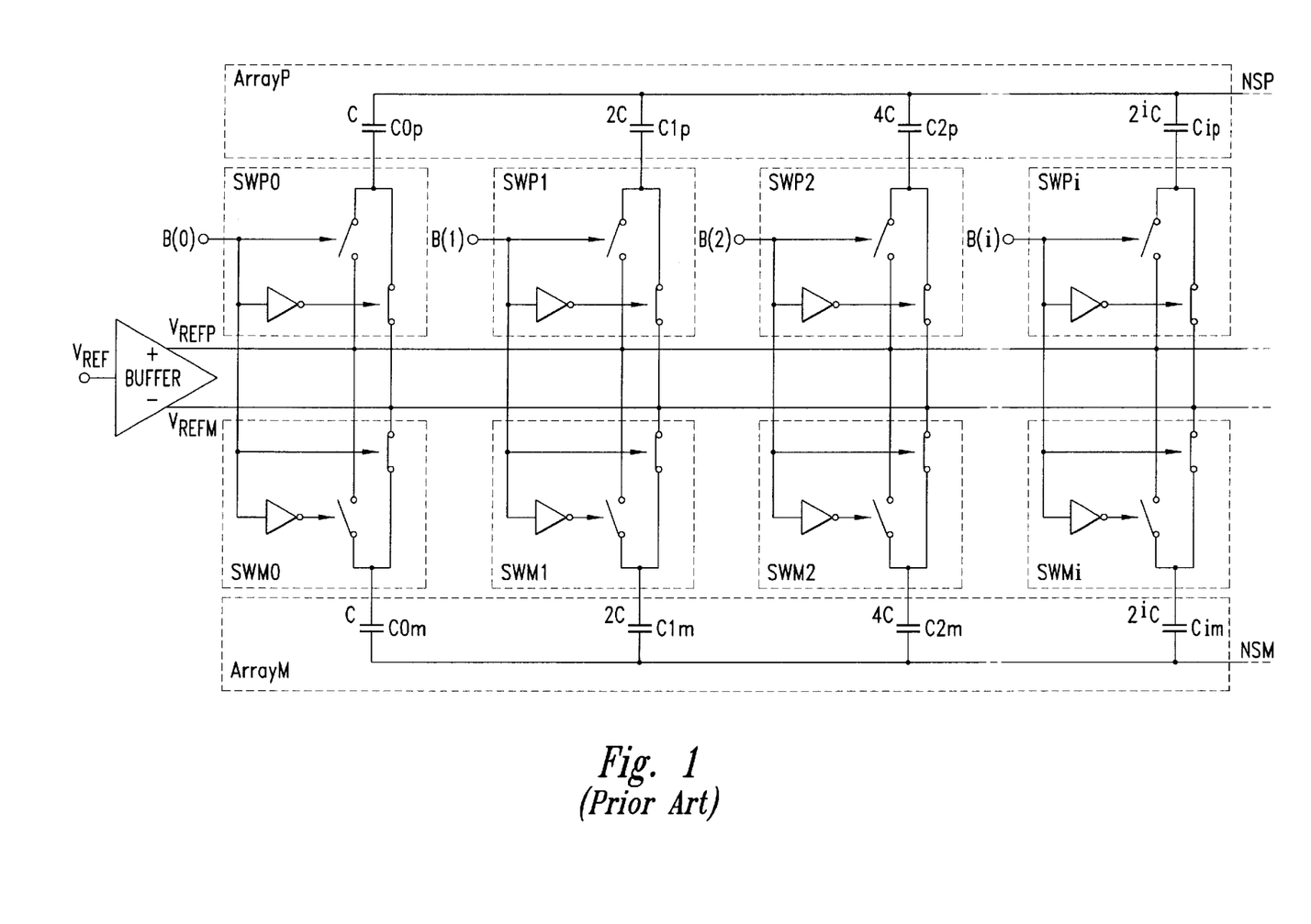
FIG. 1 illustrates schematically a prior art switched capacitor digital-to-analog converter.

FIG. 1 shows a differential digital-to-analog converter (DAC) with two weighted capacitor arrays, indicated ArrayP and ArrayM, each formed of a predetermined number n of capacitors with capacitances varying according to a factor $2^i$, where i varies from 0 to n−1. Only four capacitors per array (C0p, C1p, C2p, Cip; C0m, C1m, C2m, Cim) are shown in the figure, with capacitances C, 2C, 4C, $2^i$C. Each capacitor of ArrayP has an electrode connected to a common node NSP and another electrode connected, through a corresponding switching arrangement SWPi to a first or a to a second reference voltage terminal, indicated by the respective voltages $V_{REFP}$, $V_{REFM}$, referred to a common reference node of the integrated circuit which embodies the DAC, such as the circuit ground.

Similarly, each capacitor of ArrayM has an electrode connected to a common node NSM and another electrode connected, through a corresponding switching arrangement SWMi, to the first or to the second reference voltage terminal $V_{REFP}$, $V_{REFM}$.

The switching arrangements SWPi and SWMi operate like two-way switches controlled in phase opposition by a bit of a digital input code B(i) with i varying from 0 to n−1.

The voltage terminals $V_{REFP}$ and $V_{REFM}$ are output terminals of a circuit represented in this example as a buffer with single ended input and differential output. The input, indicated $V_{REF}$, is connected to the output of a bias circuit (not shown) which provides a stable reference voltage $V_{REF}$, substantially insensitive to variations of temperature, process and design parameters, and circuit power supply. The buffer is usually implemented as an integrated operational amplifier with a pass-band large enough to meet the converter requirements of switching speed and a current capability appropriate for the converter electric power requirements. As is known, the buffer contribution to the overall power consumption of the integrated circuit is large and in many cases is the largest portion of the converter power consumption.

Figure 5A:
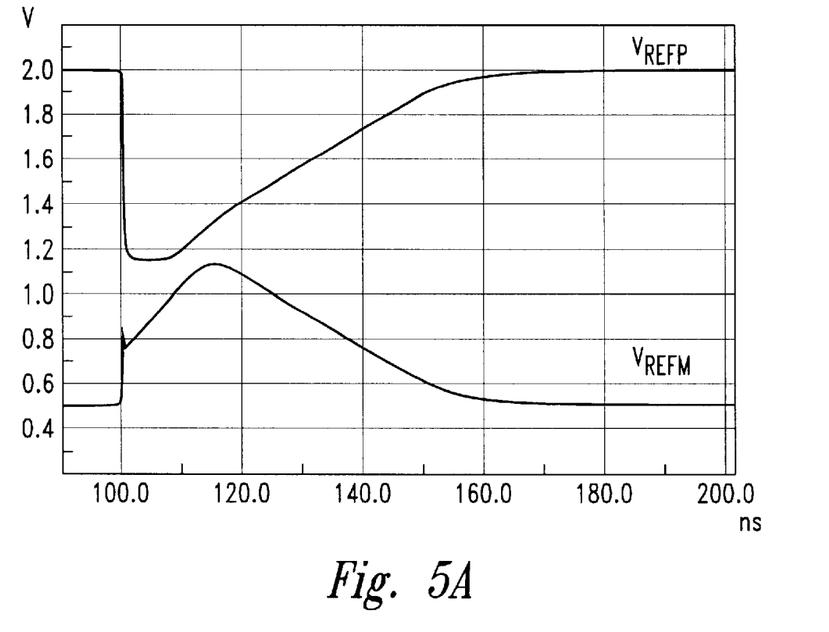

When the converter capacitors are connected to $V_{REFP}$ or $V_{REFM}$, the buffer outputs experience strong perturbations. This is because any change in the bit value of successive input digital codes requires a corresponding capacitor to be charged or discharged suddenly. Due to the limited frequency band, the operational amplifier cannot provide the necessary charges instantaneously and this causes spikes in the output reference voltages $V_{REFP}$, $V_{REFM}$. The higher the number of switched capacitors involved in the charge changing, the higher are the spikes. The nominal reference voltages are recovered in times depending on the slew rate and frequency band of the operational amplifier. FIG. 5(a) shows a typical situation at the outputs of a prior art buffer: $V_{REFP}$ changes suddenly from 2.0 V to less than 1.2 V and $V_{REFM}$ changes from 0.5 V to about 1.2 V; the transient time is about 60 ns.

A prior art approach to mitigate the effect explained above, and thus increase the switching speed, is to design a buffer with higher power and band capabilities. This approach, however, implies difficult design problems, requires larger semiconductor areas for the buffer and bias circuitry and, above all, implies a higher power consumption.

BRIEF SUMMARY OF THE INVENTION

The disclosed embodiments of the present invention provide a switched capacitor digital-to-analog converter that can be operated at a high speed and has a low power consumption.

A switched capacitor digital-to-analog converter for providing analog output signals corresponding to input digital codes is provided that includes an input terminal and at least one output terminal, a first voltage generator for providing first and second reference voltages on first and second reference terminals, respectively, a second voltage generator for providing third and fourth reference voltages on third and fourth reference terminals, said third and fourth reference voltages being selected to match predetermined design values of the first and second reference voltages, respectively, at least one array of binary weighted capacitors, each capacitor having a first electrode connected to a common circuit node, which is connected to said at least one output terminal, and a second electrode selectively connected, through associated first switching means, to either one of the first and second reference terminals or, through associated second switching means, to either one of the third and fourth reference terminals means for monitoring the values of each bit of the input digital codes, control means coupled to the first and second switching means associated with each capacitor of the array to open or close selectively during a bit clock period the connections to the first, second, third and fourth terminals according to the following criterion:

when the monitoring means detects a bit value of the current input digital code $B_j$ to be equal to the corresponding bit value of the previous input digital code $B_{j-1}$, the first switching means are enabled and the second switching means are disabled during the whole bit clock period, when the monitoring means detects a bit value of a current input digital code $B_j$ to be different from the corresponding bit value of the previous input digital code $B_{j-1}$, the first switching means are disabled and the second switching means are enabled during a starting time portion of the bit clock period, while the first switching means are enabled and the second switching means are disabled during the remaining portion of the bit clock period.

The features and advantages of the present invention will be more clearly understood from the following detailed description taken in conjunction with the accompanying drawings.

DETAILED DESCRIPTION OF THE INVENTION

Figure 2:
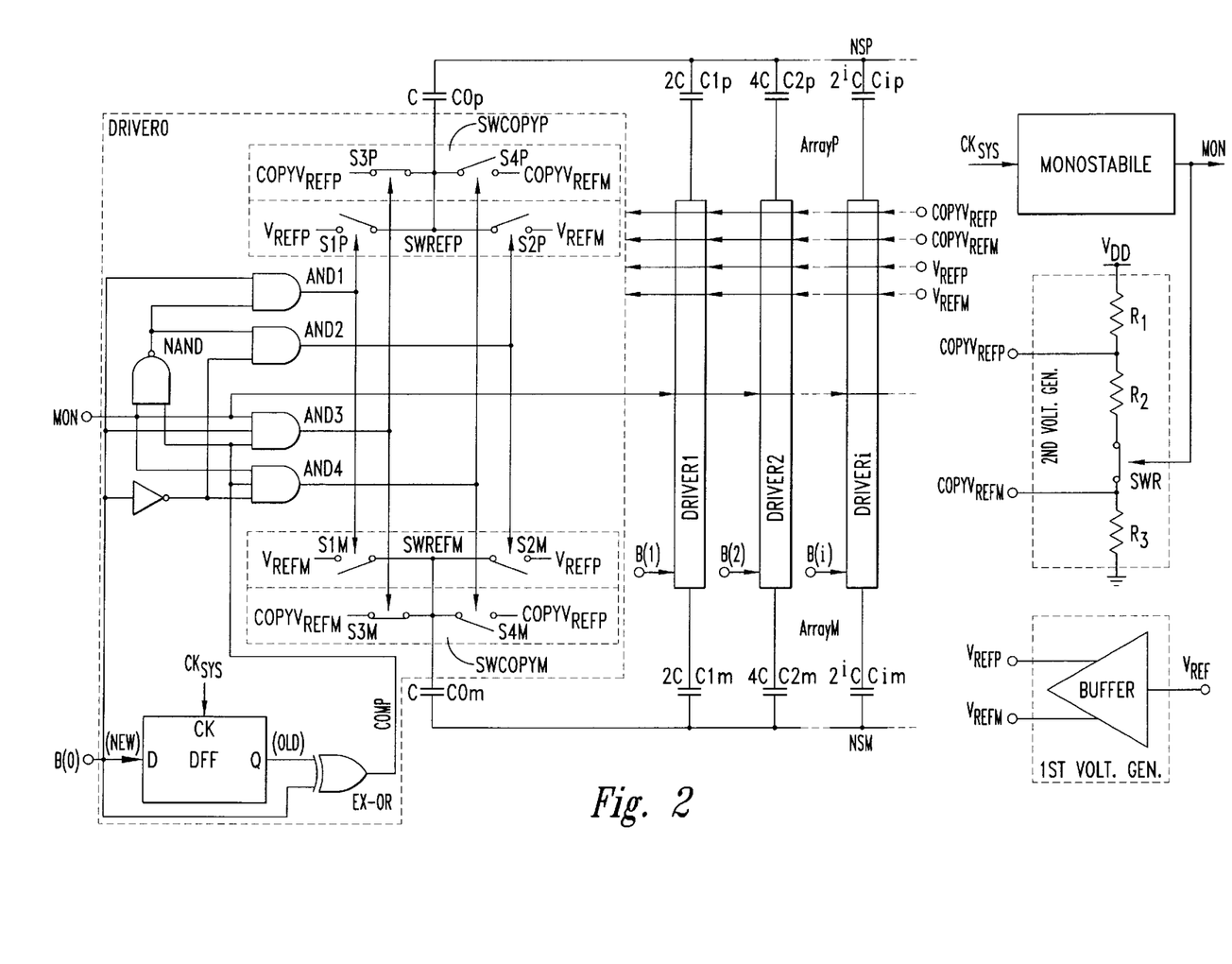
FIG. 2 illustrates schematically a switched capacitor digital-to-analog converter according to an embodiment of the invention.

FIG. 2, where components equal or corresponding to components of FIG. 1 are indicated with the same reference symbols, shows a differential DAC according to one embodiment of the invention. One skilled in the art will recognize from the following description that the invention can be implemented in a single-ended DAC as well. The DAC as shown in FIG. 2 includes a first voltage generator similar to the voltage generator of FIG. 1, represented again as a differential buffer with a single-ended input, a second voltage generator with a very low output impedance, represented in this example as a resistor voltage divider, a monostable unit, two arrays of binary weighted capacitors similar to the arrays of FIG. 1 and driver circuits, indicated DRIVER0 . . . DRIVERi, which comprise switching arrangements and switching and control logic circuits.

The voltage divider comprises three resistors $R_1$, $R_2$, $R_3$, and a switch SWR connected in series between the poles (VDD and ground) of a power supply generator. The resistances of the resistors are so selected that the voltages at the two divider taps, when switch SWR is on, are the nominal, or design values, indicated as COPYVREFP and COPYVREFM, of the reference voltages VREFP, VREFM, respectively, of the first voltage generator (buffer).

Figure 4:
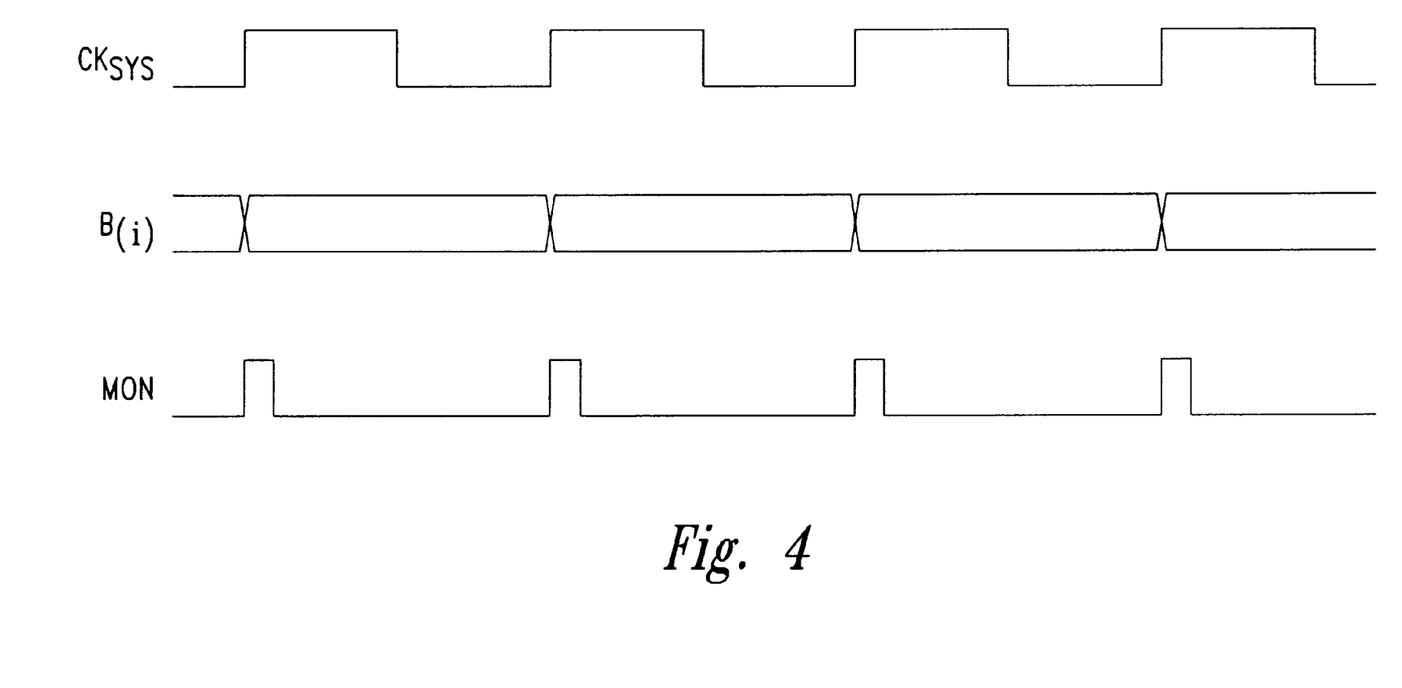
FIG. 4 shows three pulse diagrams indicative of the operation of the circuit of FIG. 2, and FIGS. 5(a)–5(c) show three voltage diagrams to explain the operation of the invention DAC in comparison with a prior art DAC.

The monostable unit is driven by a clock signal, which is preferably the system clock signal CKSYS (FIG. 4) and outputs a short pulse signal MON. The period of the clock signal is equal to the bit time of the digital code B(i), with i =0 to n−1, to be converted. The switch SWR of the voltage divider is closed only during the pulse MON.

Only one driver (DRIVER0) is shown in detail in FIG. 2, the remaining drivers being identical to DRIVER0. As is clear from the drawing, capacitors C0p and C0m of the two arrays, ArrayP and ArrayM, can be connected to one of either the reference terminals VREFP, VREFM through switches S1P,S2M and S2P, S1M, respectively, of switching arrangements SWREFP and SWREFM, or to one of the "copy" reference terminals COPYVREFP, COPYVREFM through switches S3P, S4M and S4P, S3M, respectively, of switching arrangements SWCOPYP and SWCOPYM. An analysis of the logic circuit of DRIVER0, where DFF indicates a D-flip-flop (delay flip-flop), NEW indicates the value of bit B(0) of a digital code $B_j$ to be converted at a given bit time $t_j$ and OLD indicates the value of bit B(0) of the digital code $B_{j-1}$ at a bit time $t_{j-1}$, shows that:

when B(0) of $B_j$ =B(0) of $B_{j-1}$, the output COMP of the exclusive-OR EX-OR is low, the outputs of AND gates AND3 and AND4 are low and the switches S3P, S4P, S3M, S4M are all off, the output of either AND1 or AND2 is high to close either the switches S1P and S1M or the switches S2P and S2M according to the value of B(0); in other words the switching arrangements SWCOPYP and SWCOPYM are disabled and the switching arrangements SWREFP and SWREFM are enabled, so that the capacitors C0p, C0m remain connected to either reference terminal VREFP or reference terminal VREFM;

when B(0) of $B_j \neq$B(0) of $B_{j-1}$, the output COMP of the exclusive-OR is high, during the monostable pulse (MON high) the NAND output is low, so that AND1 and AND2 have low outputs and switches S1P, S2P, S1M and S2M are open, either of the outputs of AND3 or AND4 is high to close either the switches S3P and S3M or the switches S4P and S4M: in other words, during the pulse MON the switching arrangements SWCOPYP and SWCOPYM are enabled and the switching arrangements SWREFP and SWVREFM are disabled, so that the capacitors C0p and C0m are connected to that reference terminal COPYVREFP or COPYVREFM which has a voltage equal or very close to the voltage which must be supplied to capacitors C0p and C0m according to the value of the bit B0: since the voltage divider is a voltage generator with a very low impedance, i.e., with a very high current capability, the internal electrodes of capacitors C0p, C0m are brought in a very short time to a voltage (COPYVREFP or COPYVREFM) very close to the desired voltage (VREFP or VREFM, respectively).

Figure 5B:
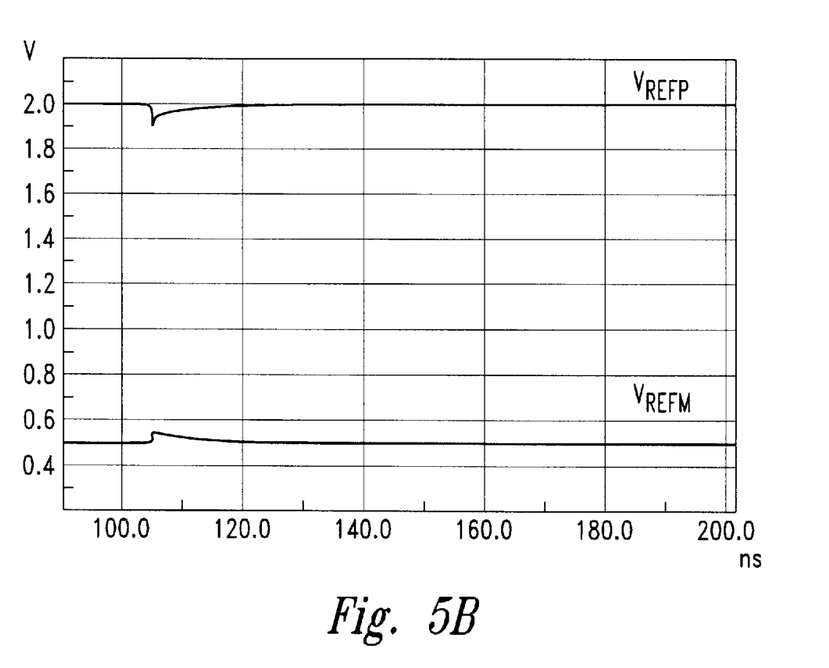
Figure 5C:
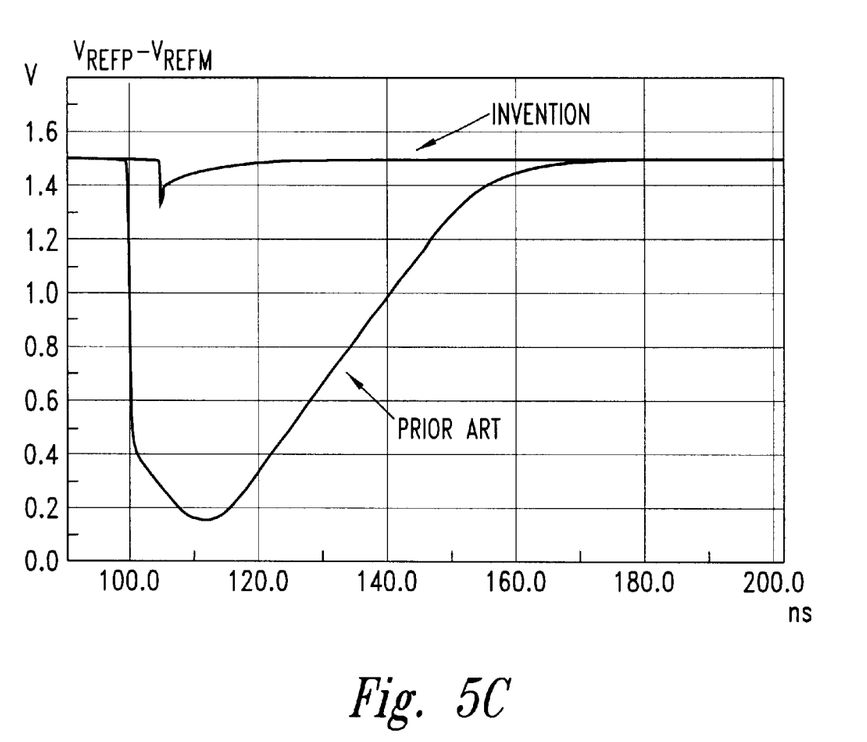

At the end of the monostable pulse (MON=0), the switching arrangements SWCOPYP and SWCOPYM are disabled and the switching arrangements SWREFP and SWREFM are enabled, so that either of terminals VREFM and VREFP is connected to the internal electrodes of capacitors C0p, C0m. Since these electrodes are close to the desired voltage, because the capacitors have been precharged by the low-impedance voltage generator, only a small amount of charges must be provided by the buffer to arrive at the desired voltage. This means that a low power buffer can be used. FIG. 5(b) shows the situation at the outputs of the same buffer used in the prior art converter of FIG. 1 in the embodiment of the invention as shown in FIG. 2: the reference voltages VREFP and VREFM are affected only by small and short spikes. It should be noted that the additional power consumption due to the voltage divider is extremely low because the voltage divider has a high efficiency and is enabled only during the short pulse from the monostable. To appreciate the difference in the operation of a buffer when employed according to the prior art and according to the invention, reference is made to FIG. 5(c) which shows the differential output voltages VREFP–VREFM in the two applications.

Figure 3:
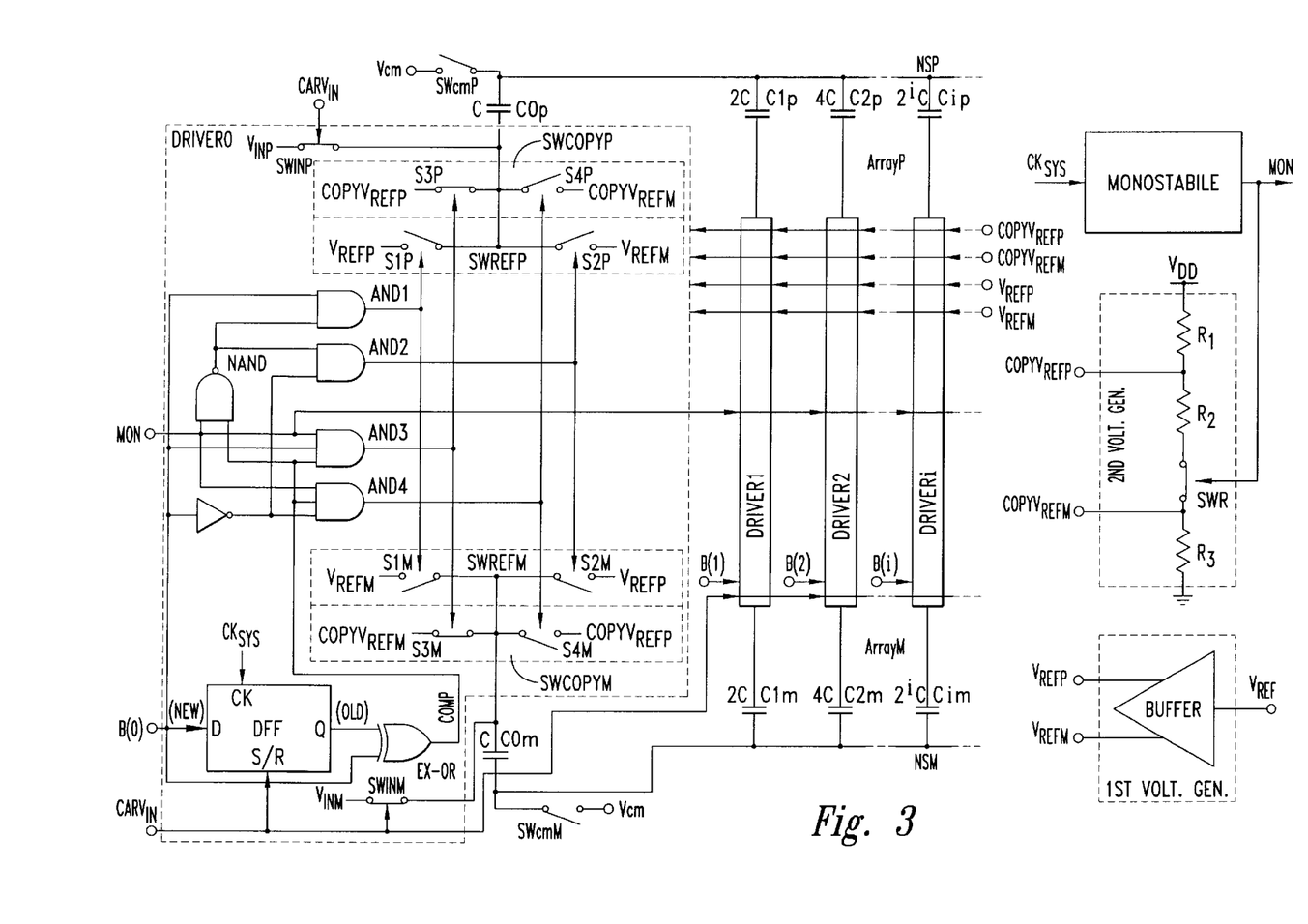
FIG. 3 illustrates schematically a digital-to-analog converter according to another embodiment of the invention as used in a SAR type analog to digital converter (ADC)

The arrangement described above for detecting whether a capacitor of an array must be switched to a reference voltage different from the reference voltage to which it was previously connected is not the only possible method. Consider, for example, the digital-to-analog converter used in a SAR type analog to digital converter (ADC) as shown in FIG. 3. As known to a person skilled in the art, a switched capacitor ADC operated according to the SAR (Successive Approximation Register) technique comprises a plurality of weighted capacitors with associated switches and a local DAC. The capacitors are charged by a voltage sample of an analog signal to be converted. The voltage sample is compared with an analog signal generated by a local DAC. Typically, the same weighted capacitor arrays are used both for the ADC and for the local DAC. When the comparison does not result in a coincidence, the local analog signal is changed to reduce the difference between the compared quantities. The comparison is repeated until the local analog signal is equal, within the limits of the converter accuracy, to the sampled analog signal. In this equality condition, the digital value of the local DAC is the digital output of the ADC corresponding to the input voltage sample.

FIG. 3 shows a circuit arrangement comprising two capacitors arrays with associated switches which are used both for a DAC similar to the DAC shown in FIG. 2 and for a SAR type ADC. FIG. 3 differs from FIG. 2 in that the internal electrodes of the capacitors can be connected to additional terminals VINP, VINM through respective switches SWINP, SWINM. The additional terminals are the differential inputs of the ADC and receive the sample voltage VINP, VINM to be converted. Both the switches SWINP, SWINM are controlled by a charging signal CARVIN generated by the control unit (not shown) of the ADC. The same charging signal CARVIN is applied to a set/reset (S/R) input of the DFF Furthermore, the common nodes NSP, NSM of the two capacitor arrays can be connected to an additional terminal of a common mode voltage Vcm through respective switches SWcmP, SWcmM controlled by the converter control logic.

In the operation, first the switches SWINP, SWINM and SWcmP, SWcmM are closed to charge the capacitors with an input differential voltage VINP, VINM, then, the digital code corresponding to Vin is defined. To this purpose SWcmP and SWcmM are opened and the switching arrangements are operated to connect successively the capacitors to the reference voltages according to the typical logic of the successive approximation algorithm. As known, according to this algorithm, in a first step (first SAR attempt) the internal electrodes of all the capacitors of each array are connected to a respective reference voltage terminal (VREFP, VREFM in the example shown). In this first step the bit values to be compared by the exclusive-OR need to be different. This can be obtained by forcing the value OLD at the DFF output through the charging signal CARVIN applied to the set/reset S/R control terminal of the DFF. Since the reference voltage (VREFP or VREFM) to be applied to the capacitors of each array is known in this case and the DFF output is initialized to the value OLD, the comparison in this first step will cause always a signal COMP=1. For example if the two capacitors C0p and C0m of ArrayP and ArrayM, respectively, must be connected to VREFP and VREFM, respectively, the S/R terminal is forced to RESET.

It should be understood that many different embodiments of the invention may be provided without departing from the spirit and scope of the invention. The invention, therefore, is not limited to the embodiment described above but is limited only by the appended claims and the equivalents thereof.

What is claimed is:

1. A switched capacitor digital-to-analog converter for providing analog output signals corresponding to input digital codes, comprising:
   an input terminal and at least one output terminal;
   a first voltage generator for providing first and second reference voltages on first and second reference terminals, respectively;
   a second voltage generator for providing third and fourth reference voltages on third and fourth reference terminals, said third and fourth reference voltages selected to match predetermined design values of the first and second reference voltages, respectively;
   at least one array of binary weighted capacitors, each capacitor having a first electrode connected to a common circuit node, which is connected to said at least one output terminal, and a second electrode selectively connected through associated first switching means to one of the first and second reference terminals or, through associated second switching means, to one of the third and fourth reference terminals;
   means for monitoring the values of each bit of the input digital codes, and
   control means coupled to the first and second switching means associated with each capacitor of the array to open or close selectively during a bit clock period the connections to the first, second, third and fourth terminals according to the following criterion:
   when the monitoring means detects a bit value of a current input digital code $B_j$ to be equal to the corresponding bit value of a previous input digital code $B_{j-1}$, the first switching means are enabled and the second switching means are disabled during a whole bit clock period, and
   when the monitoring means detects a bit value of the current input digital code $B_j$ to be different from the corresponding bit value of the previous input digital code $B_{j-1}$, the first switching means are disabled and the second switching means are enabled during a starting time portion of the bit clock period, while the first switching means are enabled and the second switching means are disabled during the remaining portion of the bit clock period.

2. The switched capacitor digital-to-analog converter of claim 1 wherein the first voltage generator comprises an operational amplifier having said first and second terminals as differential outputs.

3. The switched capacitor digital-to-analog converter of claim 1 wherein the second voltage generator comprises a low-impedance voltage generator, with said voltage generator having said third and fourth terminals as its outputs.

4. The switched capacitor digital-to-analog converter of claim 3 wherein the low-impedance voltage generator comprises a resistor voltage divider.

5. The switched capacitor digital-to-analog converter of claim 1 wherein the monitoring means comprise a flip-flop having an input connected to the input terminal of the digital-to-analog converter and an output, an exclusive OR gate having a first input connected to the flip-flop output, a second input connected to the flip-flop input, and an output connected to the control means.

6. The switched capacitor digital-to-analog converter of claim 1, comprising a monostable unit having an input connected to the output of a system clock and an output connected to said control means.

7. The switched capacitor digital-to-analog converter of claim 6 wherein the second voltage generator comprises an enable input connected to the monostable unit output.

8. The switched capacitor digital-to-analog converter of claim 1, comprising two arrays of binary weighted capacitors having their respective common circuit nodes as differential output terminals of the digital-to-analog converter.

9. A successive approximation digital-to-analog converter comprising a switched capacitor digital-to-analog converter according to claim 1.

10. A successive approximation digital-to-analog converter comprising a switched capacitor digital-to-analog converter according to claim 8.

11. A method of controlling a switched capacitor digital-to-analog converter for providing analog output signals corresponding to input digital codes, the converter including at least one array of binary weighted capacitors, each capacitor having a first electrode connected to a common circuit node that is connected to at least one output terminal of the converter, and a second electrode selectively connected through an associated first switch to one of first and second reference terminals or through an associated second switch to one of third and fourth reference terminals, the method comprising:
   monitoring the values of each bit of the input digital code; and
   controlling the first and second switches associated with each capacitor of the array to selectively open or close connections to the first, second, third, and fourth terminals during a bit clock period according to the following criterion:

when a bit value of a current input digital code $B_j$ is equal to the corresponding bit value of a previous input digital code $B_{j-1}$, the first switches are enabled and the second switches are disabled during the whole bit clock period, and when the bit value of the current input digital code $B_j$ is different from the corresponding bit value of the previous input digital code $B_{j-1}$, the first switches are disabled and the second switches are enabled during a starting time portion of the bit clock period, and then first switches are enabled and the second switches are disabled during the remaining portion of the bit clock period.

12. The method of claim 11, initially comprising generating the first and second reference voltages at a first voltage generator that comprises an operational amplifier having differential outputs, and generating the third and fourth voltages at a second voltage generator that comprises a low-impedance voltage generator.

13. A switched capacitor digital-to-analog converter for providing analog output signals corresponding to input digital codes, comprising:

at least one array of binary weighted capacitors, each capacitor having a first electrode connected to a common circuit node that is connected to at least one output terminal of the converter, and a second electrode selectively connectable through a first switch to one of first and second voltage reference terminals or through a second switch to one of third and fourth voltage reference terminals; and a control circuit coupled to the first and second switches associated with each capacitor of the array to open or close selectively connections to the first, second, third, and fourth terminals according to the following criterion:

when a bit value of a current input digital code $B_j$ is equal to the corresponding bit value of a previous input digital code $B_{j-1}$, the first switches are enabled and the second switches are disabled during the whole bit clock period, and when a bit value of the current input digital code $B_j$ is different from the corresponding bit value of the previous input digital code $B_{j-1}$, the first switches are disabled and the second switches are enabled during a starting time portion of the bit clock period, and then the first switches are enabled and the second switches are disabled during a remaining portion of the bit clock period.

14. The converter of claim 13, further comprising a monitor unit configured to monitor the values of each bit of the input digital code and outputting the same to the control circuit.

15. The circuit of claim 14 wherein the monitoring unit comprises a flip-flip having an input connected to an input terminal of the digital-to-analog converter and an output; and an exclusive OR gate having a first input connected to the flip-flop output, a second input connected to the flip-flop input, and an output connected to the control circuit.

* * * * *